United States Patent [19]

Everard

[11] 4,209,773
[45] Jun. 24, 1980

[54] CODE CONVERTERS

[75] Inventor: John D. Everard, Ipswich, England

[73] Assignee: Post Office, London, England

[21] Appl. No.: 855,784

[22] Filed: Nov. 28, 1977

[30] Foreign Application Priority Data

Dec. 1, 1976 [GB] United Kingdom ............... 50096/76

[51] Int. Cl.$^2$ ............................................. H03K 13/02
[52] U.S. Cl. ............................................. 340/347 DA
[58] Field of Search ............... 340/347 AD, 347 DA, 340/347 DD, 347 M; 365/733, 734, 786

[56] References Cited

U.S. PATENT DOCUMENTS

| | | | |
|---|---|---|---|
| 3,292,173 | 12/1966 | Horton | 340/347 DA |
| 3,757,261 | 9/1973 | Sather | 364/733 |
| 4,006,475 | 2/1977 | Candy | 340/347 DA |
| 4,079,373 | 3/1978 | Brown | 340/347 M |
| 4,086,656 | 4/1978 | Brown | 364/733 |

OTHER PUBLICATIONS

Ritchie, "IEEE Transactions on Communications," vol. Com-22, No. 11, Nov. 1974, pp. 1797–1806.
Insam, "Electronics," Dec. 20, 1973, vol. 46, p. 113.

Primary Examiner—Charles D. Miller
Attorney, Agent, or Firm—Mason, Fenwick & Lawrence

[57] ABSTRACT

A digital-to-analogue converter which uses a technique of two-level quantization in order to generate a pulse density code signal which yields the analogue signal when filtered. Standard digital logic adders and registers are used in the conversion of PCM signals to the pulse density code. The adders and registers are arranged as a feedback loop in which an approximation signal capable of either a "high" or a "low" level is compared repetitively with a PCM signal and the difference is accumulated, but at the end of each operation the accumulated total is tested and the value of the approximation signal for the next cycle is chosen so as to reduce the accumulated total. The cycle period is set by a clock, and the approximation signal is the pulse density code signal. The noise spectrum of the pulse density code signal may be adjusted by the addition of an offset signal to the incoming PCM signal. The digital-to-analogue converter is suitable for use in converting linear PCM telephone speech signals into analogue signals.

5 Claims, 7 Drawing Figures

DIGITAL DELTA SIGMA MODULATOR JUST PRIOR TO THE N TH DIGITAL INTEGRATOR CLOCK CYCLE

| x | q | (x-q) | | O/P |
|---|---|---|---|---|
| (÷4) | (±16) | | ←000000 | 1 |
| 00100 | 010000 | 110100 → | 110100 | 0 |
| 00100 | 110000 | 010100 ← | 001000 | 1 |
| 00100 | 010000 | 110100 + | 111100 | 0 |
| 00100 | 110000 | 010100 | 010000 | 1 |
| 00100 | 010000 | 110100 | 000100 | 1 |
| 00100 | 010000 | 110100 | 111000 | 0 |
| 00100 | 110000 | 010100 | 001100 | 1 |
| 00100 | 010000 | 110100 | 000000 | 1 |

OUTPUT SEQUENCE

CODE CONVERTERS

This invention relates to a method and apparatus for converting a pulse code modulated signal into an analogue signal.

In communication systems, and in control systems, there are a number of advantages in the use of digital signal processing techniques within the system, but it is often necessary to convert the information from the analogue form to the digital form, and vice versa, at one or more points in the system. For example, it is generally recognized that telephone or television information transmitted in digital code has better immunity from noise than analogue information, but a telephone system must accept an analogue input and provide an analogue output when used for speech transmission, and a television system will generally have an analogue input and an analogue output.

A number of known digital-to-analogue converters employ a network of switches and resistors to generate an output analogue signal as the weighted sum of a number of individual signals controlled by the input digital code. In decoding N-bit binary words, for example, the switched network normally contains N switches and must be capable of precisions in excess of 1 in $2^N$ in order to space the output levels correctly. When N is larger than 10, say, the networks become difficult to construct and are therefore expensive. In addition, this form of construction is not easily adapted to integrated circuit technology which is the prevailing trend in fabrication.

The use of pulse code modulated signals in telephone speech transmission depends on the availability of relatively cheap and compact digital-to-analogue converters which can handle digital codes having in the region of thirteen bits. One standard code used in telephone speech transmission is "A law" compressed pulse code modulation which results in the use of 8 bits, this compressed code corresponding to 13-bit linear pulse code modulation, hence the reference to thirteen bits. It will be appreciated that a digital-to-analogue converter capable of handling a 13-bit code and constructed of switches and precision resistors would be extremely expensive.

Digital-to-analogue converters which avoid the use of precision resistors are also known. One such digital-to-analogue converter employs only digital components, and operates to generate pulse sequences which correspond uniquely to the digital input words, as in the manner of a binary rate multiplier (BRM). The resulting pulse sequence is then subjected to low-pass filtering in order to provide an analogue signal. In applying such a digital-to-analogue converter to telephone speech communication, the device would need to accommodate 13-bit linear PCM samples arriving at the rate of 8000 samples per second. This would require the generation of up to $2^{13}-1$ pulses every 125 microseconds, corresponding to a pulse output rate of 65.5 million pulses per second. This is generally avoided by the use of multi-level output pulses in order to reduce the output pulse rate to a manageable level, and is effected by the use of analogue components which provide the multi-level output pulses. The analogue components need to have precise values in order to ensure good linearity in the transfer characteristic, and because of this practical forms of the BRM digital-to-analogue converter are not readily implemented in integrated circuit form.

For digital to analogue conversion, it would be possible as an intermediate step, to produce a pulse density coded signal in response to a digital signal. A pulse density coded signal is one which consists of impulses of the same amplitude either of variable duration, or of the same duration but of variable frequency, so that the mean level of the signal over a period of time, long in comparison with the pulse duration, is equal to that analogue signal level which is equivalent to the digital signal. An analogue signal can be produced from a pulse density coded signal simply by smoothing.

It is an object of the present invention to provide apparatus for converting pulse code modulated information into single bit or pulse density code from which the analogue information is easily recoverable.

According to the present invention there is provided apparatus for converting pulse code modulated (PCM) information into a pulse density code, the PCM information consisting of parallel words of m bits expressed in two's complement form, the apparatus comprising:

(a) an offset signal generator providing input ports to the said apparatus and arranged to add an offset signal to and input signal, (b) an accumulator having at least m+1 stages, (c) means responsive to the digit stores in the m+1 th stage of the accumulator after the immediately preceding accumulation operation, to produce a to-state signal, (d) connection means arranged to apply output words from the offset signal generator to the m accumulator stages of lower significance, and arranged to apply, simultaneously, a signal dependent on the two-state signal to at least the m+1 th accumulator stage, and (e) means responsive to the two-state signal to produce a pulse density code output corresponding to the PCM information word applied to the apparatus.

In one example of the invention, the accumulator has m+1 stages, the two-state signal is derived by inverting the state of the m+1th state, and the m th or sign digit of the P.C.M. word is inverted on application to the accumulator. If the accumulator has more than m+1 stages, the two-state signal may be applied to several adjacent stages, for example, the m+1th, the m+2th, and the m+3th, and the two-state signal derived by inverting the state of the m+3th stage.

The rate at which the accumulation operations are performed may be, for example, 256 times the sampling rate of the pulse code modulated information, but in any case should be much higher than the sampling rate.

The addition of a constant offset signal to the PCM information causes a controlled shift in the spectrum of noise appearing in the single bit code signal.

In practice the accumulator may comprise a plurality of logical adders coupled to corresponding register elements, arranged to provide the necessary system capacity.

A demodulator for obtaining an analogue signal from a P.C.M. signal comprises the combination of the apparatus just described and a low-pass filter or smoothing circuit.

Apparatus for converting pulse code modulated information into a single digit code will now be described by way of example only, and with reference to the accompanying drawings, in which.

Figure 1:
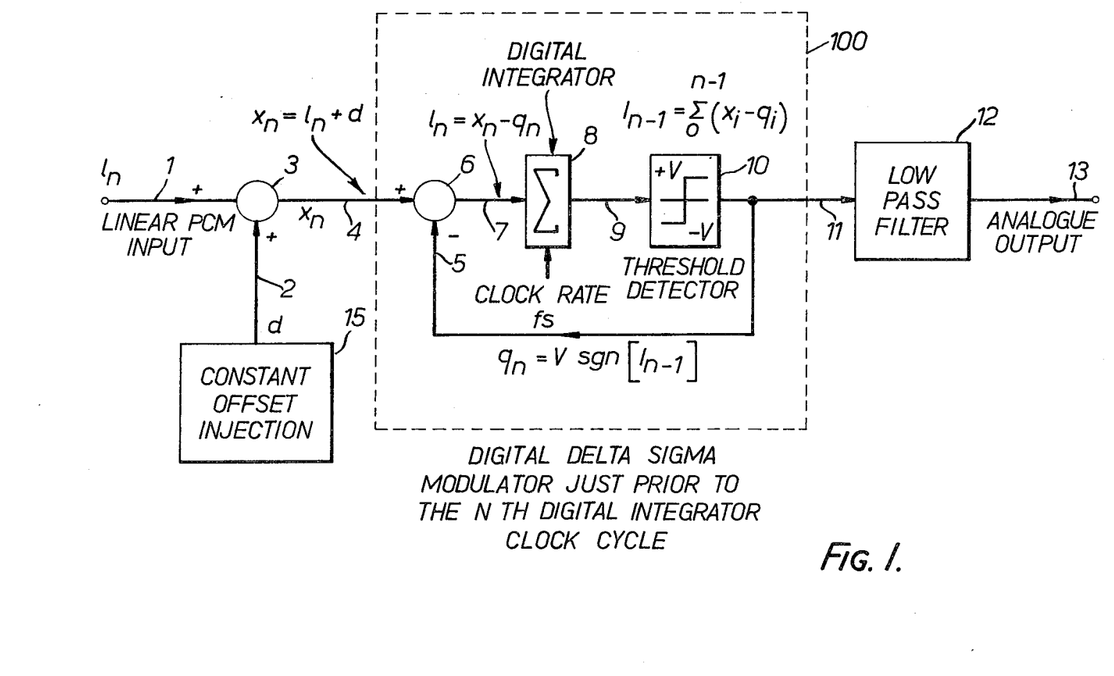
FIG. 1 is a schematic representation of a demodulator which includes a code converter suitable for converting pulse code modulated information into a pulse density code.

Referring now to FIG. 1, the demodulator for converting a pulse code modulated signal into its analogue form consists of a code converter 100, which converts a pulse code modulated signal into a pulse density code, a low pass filter 12, which extracts the analogue signal from the pulse density code, and an offset signal generator 15. A pulse code modulated (PCM) signal applied to the input part 1 of the demodulator, has added to it at a summing point 3, an offset signal supplied by the offset signal generator 15. The offset signal has a constant level and is effective in shifting the quantisation noise spectrum of the pulse density modulated signal. The PCM signal with the added offset is then passed to the code converter which is a recirculating loop arrangement wherein the output signal is fed back to a subtraction point at the input.

The code converter 100, consists of a subtraction means 6 which functions to determine the difference between the present input signal, and the previous output signal from the code converter 100, and to present this difference signal to a digital integrator 8. The difference signals are integrated by successive addition to an accumulated total at a rate determined by a clock signal and the total is applied to a threshold detector 10. The output of the threshold detector 10 can assume either a high positive digital value or a high negative digital value. The loop is so arranged that the output signal from the threshold detector 10 is changed from one to the other when the total crosses the zero threshold.

The output signal from the threshold detector 10 which forms the output of the code converter 100, is a pulse density signal which can be smoothed to give the analogue signal represented by the PCM signal, and the code converter 100 maintains an internal total which has an average value of substantially zero when taken over a long period. The analogue signal is formed by means of a low pass filter 12.

In a particular embodiment of the code converter 100, given an input value of $x_n$, a total of $I_n$ after n additions and a value $q_n$ fed back from the output to the input, it can conveniently be arranged that $q_n = V$ sgn $[I_{n-1}]$, where V denotes the output signal amplitude and sgn $[I_{n-1}]$ denotes the sign (negative or positive) of $I_{n-1}$.

Hence, $$e_n = x_n - q_n$$

where $e_n$ is the input to the digital integrator and $$I_n = I_{n-1} + e_n.$$

Therefore, over a period of p cycles, $$I_n = I_{n-p} + \sum_{i=n-p+1}^{n} (x_i - q_i)$$

$$\frac{1}{p} \sum_{i=n-p+1}^{n} x_i = \frac{1}{p} \sum_{i=n-p+1}^{n} q_i + \frac{1}{p} [I_{n-p} I_n]$$

The final equation indicates that the mean value of q over p cycles is equal to the mean value of x plus some error term. Therefore the mean value of q tracks the low frequency components of the x and the output of the code converter includes the analogue signal represented by the PCM signal.

The offset signal injected into the code converter 100 along and the PCM signal has the effect of modifying the noise frequency components of the code converter signal. If the situation without, and with, the offset signal is considered the reasons become clear. With no offset signal, and a zero level input signal, the code converter will tend to oscillate evenly and produce a zero level mean output with switching noise centered at half the switching frequency. A small input signal will modify the switching pattern slightly to give a small mean output level. The small signal level is obtained by an infrequent disturbance of the even switching pattern, which results in low frequency noise components which are within the signal baseband and which cannot easily be filtered out. By introducing the offset signal, the low frequency components of switching noise are reduced and the signal/noise ratio improved at low input signal levels. The magnitude of the offset signal is a compromise between the noise redistribution and the reduction in the peak signal amplitude that can be handled. The optimum value for the offset signal includes the values V/4 and V/16, and all values lying between these two limits.

Figure 2:
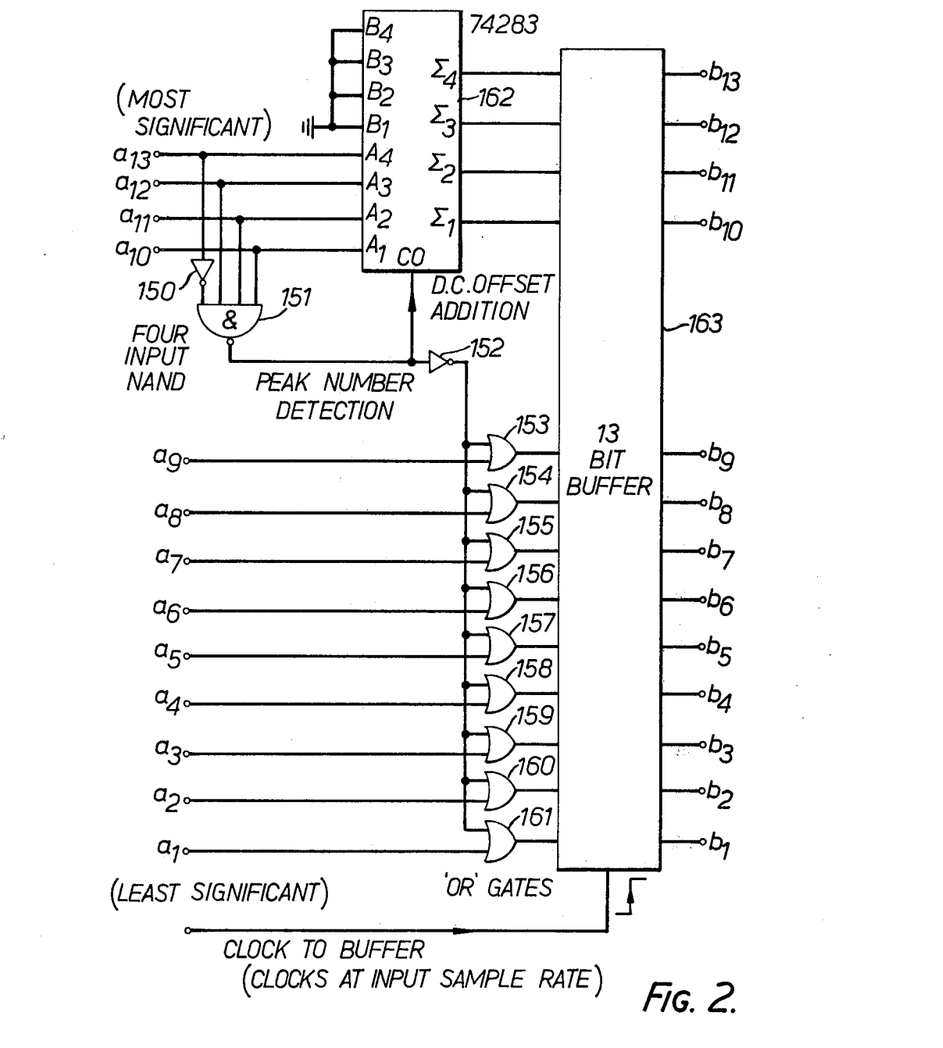
FIG. 2 is a schematic representation of an offset signal generator adapted to operate in TWO'S COMPLEMENT code.

FIG. 2 illustrates the offset generator 15. The PCM signal in TWO'S COMPLEMENT is represented as the inputs $a_1$–$a_{13}$, the bit $a_1$ being the least significant digit and the bit $a_{13}$ being the most significant digit.

The offset generator performs the function of offset addition with automatic overflow detection and limiting. Its operation is best explained by considering the addition of an offset equal to V/8. In 13-bit binary this is represented by 0001000000000. When this is added to a 13-bit input the least significant digits $a_1$–$a_9$ are unaffected since the first nine digits of the offset word are zero. Only the four most significant bits $a_{10}$–$a_{13}$ are affected, and addition can be performed by a four-bit adder. The adder 162 shown in FIG. 2 (SN 74283) provides more facilities than are required for this operation. In this application the Co and $A_1$–$A_4$ input terminals are used and the $B_1$–$B_4$ terminals are grounded. It will be appreciated that the adder may be made to perform the same function in other configurations.

The offset signal may be injected without difficulty except when the input signal digits $a_{13}$–$a_{10}$ are 0111, which is near the maximum positive value of x, when addition of an offset of 0001000000000 would cause overflow. The output would then be 1000 XX . . . X, which is a negative value. (X denotes a "don't care" condition for the remainder of the digits). This possibility is dealt with by looking for an 0111 input for $a_{13}$–$a_{10}$. The NAND gate 151 provides a logical 1 output at all times except when the input if 0111 for $a_{13}$–$a_{10}$ and this logical 1 input is fed into the Co input of the adder 162 to provide the correct offset. The $a_1$-$a_9$ digits pass through the OR gates 153-161 unaffected.

When the 0111 condition is detected for $a_{13}$-$a_{10}$, the input to the NAND gate 151 becomes 1111, and its output becomes logical 0. The input to the Co terminal of the adder 162 is therefore a logical 0 and the $a_{13}$-$a_{10}$ digits are allowed to pass through the adder unaffected, but at the same time the inverter 152 places a logical 1 on the input of all the OR gates 153-161, thereby changing the $a_1$-$a_9$ digits to logical 1. The output therefore becomes 0111111111111. This is still positive. This means that the converter overloads when the input reaches $\frac{7}{8}$ V instead of V but this loss in dynamic range is negligible, since it is equivalent to a reduction of about 1.16 dB in approximately 60 dB of dynamic range.

Figure 3:
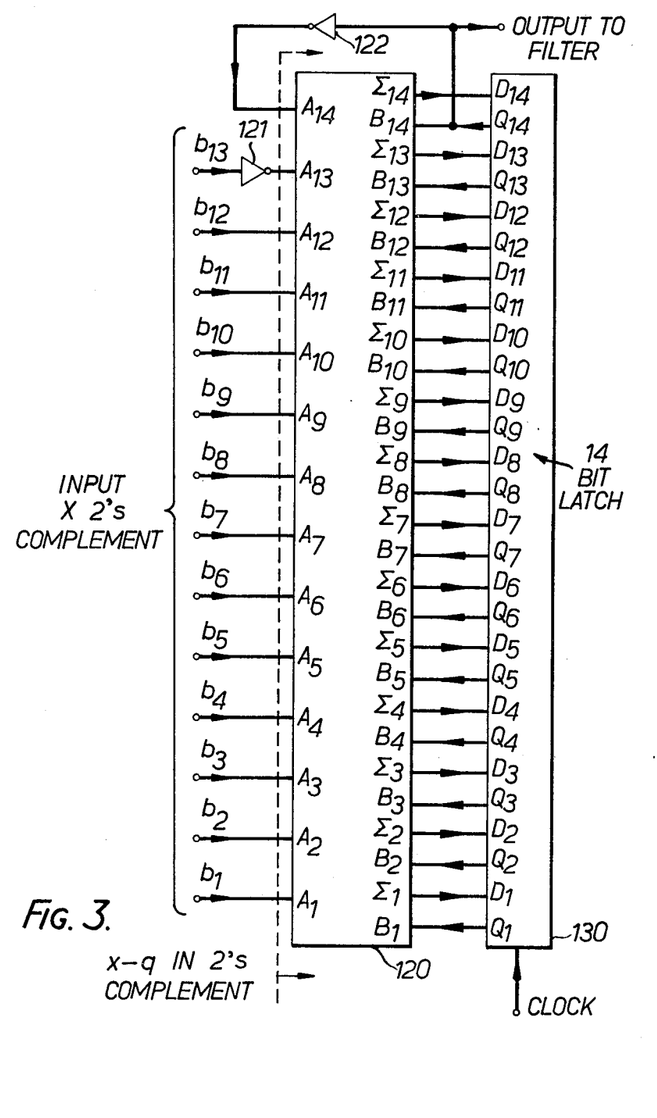
FIG. 3 is a schematic representation of a code converter suitable for converting pulse code modulation in TWO'S COMPLEMENT code into a pulse density code.

The code converter 100 is illustrated in more detail in FIG. 3, the signal $b_1$-$b_{13}$ being applied to the input terminals of a logic adder/subtractor 120. The incoming PCM information is accumulated in the register 130, which is clocked at a frequency many times the sampling rate of the PCM information. The adder/subtractor 120 and the register 130 together constitute a digital integrator. The clocking frequency of the register 130 is typically 2.048 MHz, which is about 256 times the PCM information sampling rate. The register 130 stores the data presented to it by the adder/subtractor 120 for one clock interval, and returns the stored information to the adder/subtractor 120 for addition to the input information presented to the adder/subtractor 120 at the time. The adder/subtractor 120 and the register 130 together accumulate the incoming PCM information at the clocking rate of the register 130 and the information which has a least significant digit $b_1$, and a most significant digit $b_{13}$, is added to the digit $b_{14}$ inverted by inverter 122 which is applied to the input $a_{14}$ of the 14th stage, again at the clocking frequency of the register 130. The digit $b_{14}$ forms the output signal of the converter. The most significant digit $b_{13}$ of the PCM signal is inverted before application to the adder/subtractor 120.

Figure 6:
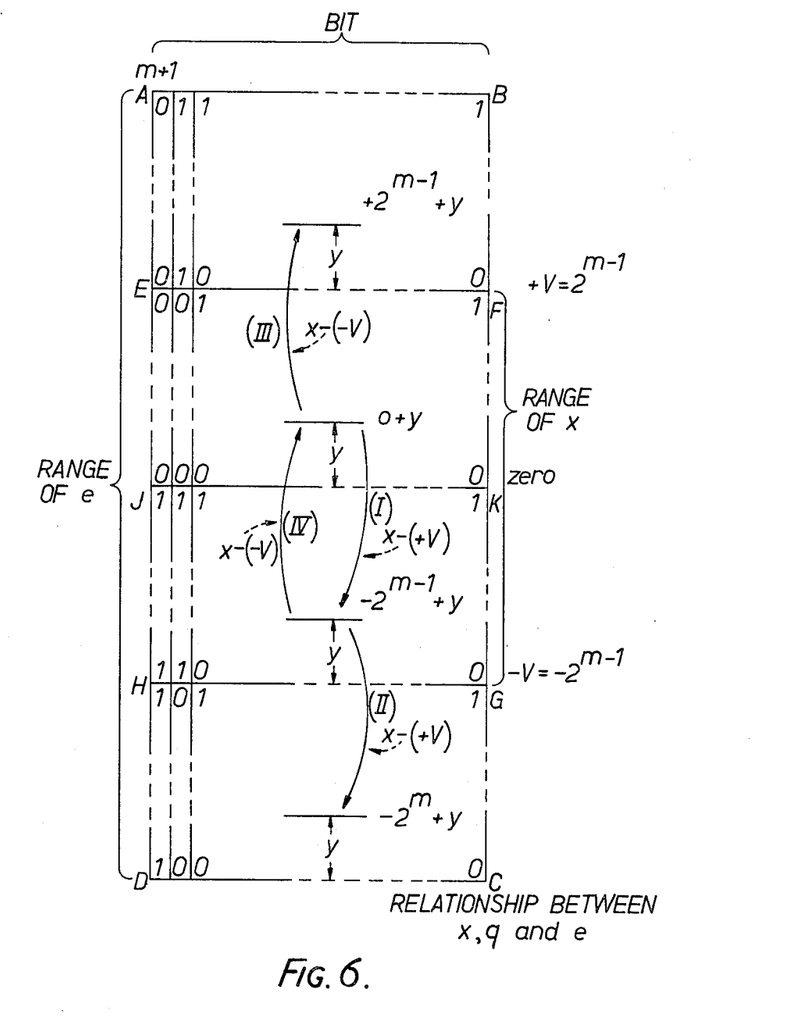
FIG. 6 is an operational representation of the code converter.

FIG. 6 illustrates the logic situation in the operation of the code converter 100, which consists of the adder/subtractor 120 and the register 130, and two inverters 121 and 122. Referring to FIG. 6, the range of e, the input to the digital integrator derived from x-q, is shown as the full height AD of the rectangular box ABCD, this range corresponding to m+1 bits when the range of x is m bits. The range of x is consequently shown as a height EH contained symmetrically within the rectangular box ABCD.

Because of the value of v that is used, the binary number $x_n$-$q_n$ can be formed from the sign of $I_{n-1}$ inverted, the sign of x inverted and the $b_1$ to $b_{13}$ bits of x, which results in the relatively simple logic system shown in FIG. 3 effecting the computation of $x_n$-$q_n$ without the need for full subtraction. The value x is represented by a TWO'S COMPLEMENT number m (=13) bits in length, where $-2^{m-1} \leq x \leq 2^{m-1}-1$. A positive value of x may be represented as $-2^{m-1}+y$, where y is a positive binary number m-1 bits long and y has a value equal to the m-1 least significant bits of x. There are therefore four possible combinations of the signs of x and q. These four possible combinations of signs are illustrated in FIG. 6, and are the following:

(i)

$x=0+y$ i.e. x positive, and
$q=2^{m-1}$ i.e. q positive
Then
$e=x-q=-2^{m-1}+y$ (ii)

$x=-2^{m-1}+y$ i.e. x negative, and
$q=2^{m-1}$ i.e. q positive
Then
$e=x-q=-2^m+y$ (iii)

$x=0+y$ i.e. x positive, and
$q=-2^{m-1}$ i.e. q negative
Then
$e=x-q=2^{m-1}+y$ (iv)

Figure 4:
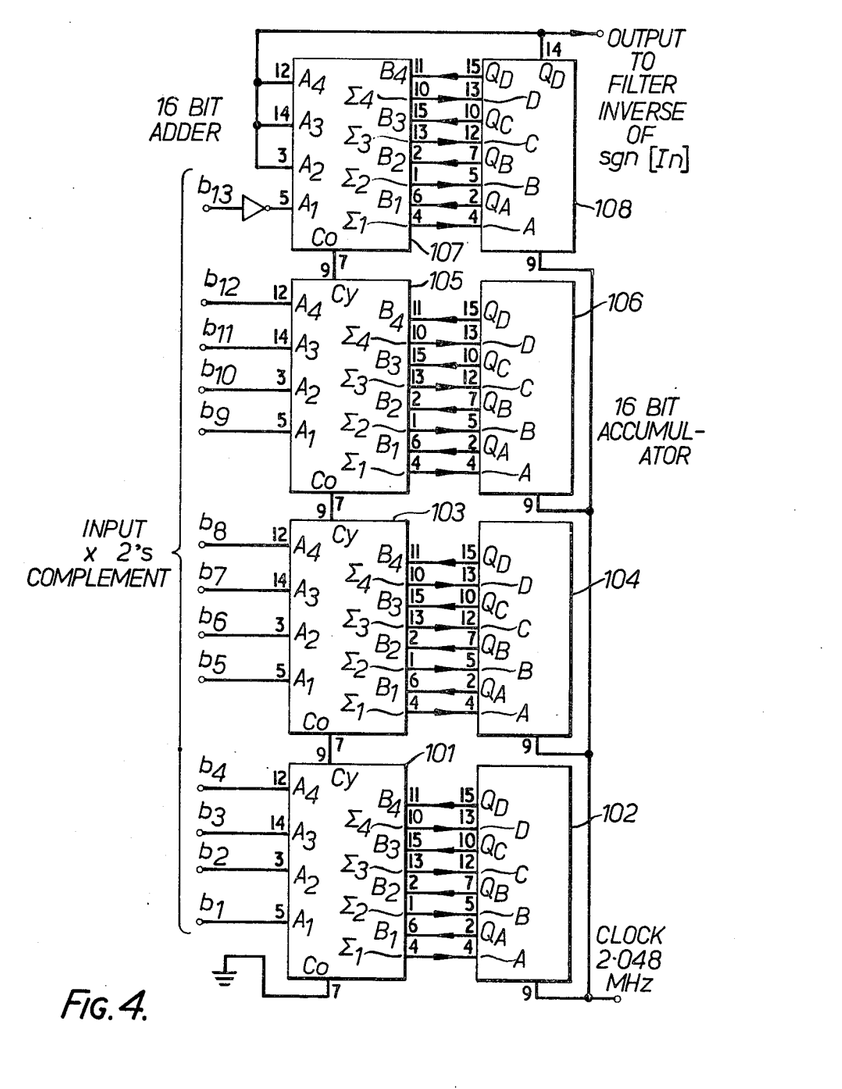
FIG. 4 is a more detailed schematic representation of the code converter showing its implementation with components at present available.

$x=-2^{m-1}+y$ i.e. x negative, and
$q=-2^{m-1}$ i.e. q negative
Then
$e=x-q=0+y$ FIG. 4 is a more detailed representation of the code converter 100, using the logic blocks generally available as logic system components. The logic blocks 101, 103, 105 and 107 represent four 4-bit binary full adders with fast carry, typified by the type SN 74283 integrated circuit, and the logic blocks 102, 104, 106 and 108 represent four quadruple D-type flip-flops with clear, typified by the type SN 74175 integrated circuit. The four adders 101, 103, 105 and 107 make up the block 120 of FIG. 3, and the four flip-flops 102, 104, 106 and 108 make up the block 130 of FIG. 3. In this implementation, the input signal is processed as 4-bit words (the maximum capacity of each adder) and a CARRY is passed to the next group of more significant 4-bit words when appropriate. The inverted form of $I_n$ is obtained by taking an output from an inverting terminal ($\overline{Q}_D$) of one of the flip-flops of the block 108. The four 4-bit binary full adders 101, 103, 105, and 107 provide an adder with a capacity of 16 bits, whereas a 14-bit capacity is the minimum capacity required to handle the 13-bit input shown in the Figures. Therefore, no connection need be made to the A3 and A4 inputs of the adder 107, but these may be connected as shown without affecting the system operation.

Figure 5:
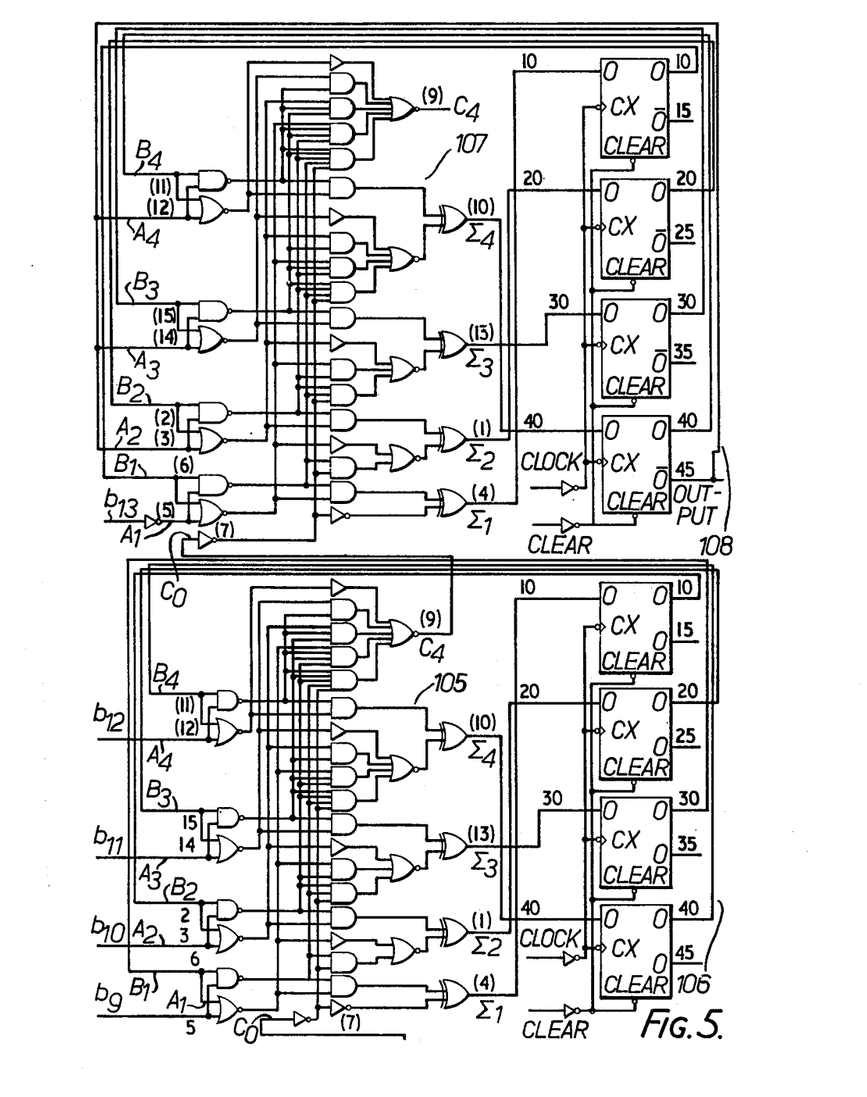
FIG. 5 is a detailed schematic representation of part of the code converter showing the internal logic arrangements of the block components of FIG. 4.

FIG. 5 shows the smaller scale logic arrangements provided within the logic elements 105, 106, 107 and 108 and the interconnections. The interconnection arrangements for the logic elements 101, 102, 103 and 104 are the same as those for logic elements 105 and 106. Further details of the design characteristics of the logic elements are obtainable from the appropriate data books provided by manufacturers.

Figure 7:
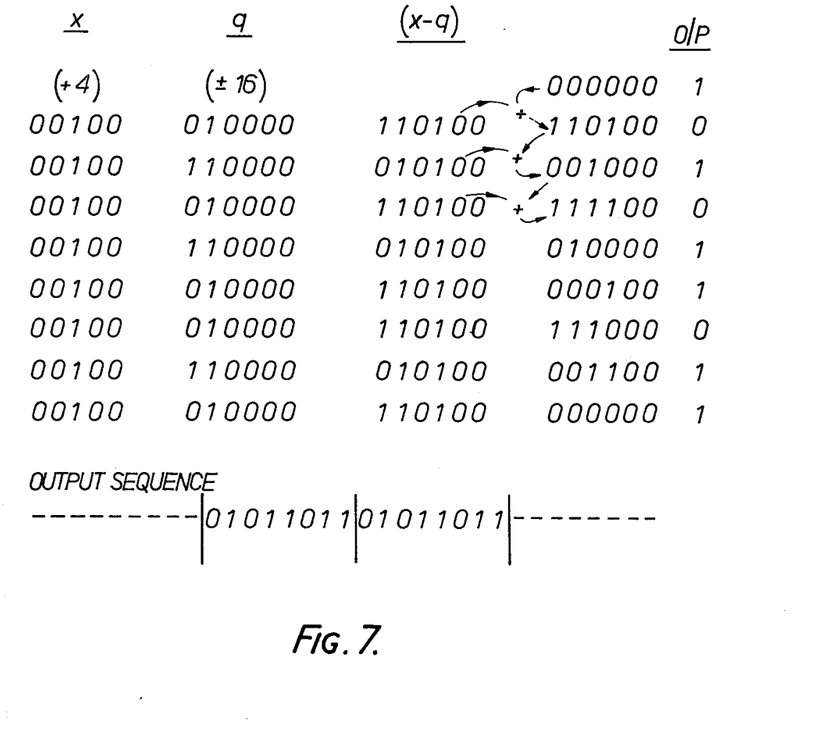
FIG. 7 illustrates a sequence of values of x, q, x–q, I and the output for 5-bit input samples when the input equals +4.

FIG. 7 is provided as an example of the word sequences that may occur in a digital demodulator according to the invention. Five-bit input samples are used in the illustration so that the operations can be more easily followed. The value of q can be either +16 or −16, and at the output a logical 1 is taken to represent +16 and a logical 0 is taken to represent −16. The sequence represented in FIG. 7 relates to a continuing input of +4 (0 0100) which gives rise to an output sequence of 01011011, which can give a mean value of $\frac{1}{8}[-16+16-16+16+16-16+16+16]$ This works act as 32/8 = +4. In this instance at least eight clock periods are required to reduce the error term to zero. In normal operation the output would be averaged over many more than eight clock pulses.

A suitable clocking rate for the code converter is 2.048 MHz, which means that the code converter can be made by MOS large scale integrated circuit technology as a single integrated circuit or as part of a larger integrated circuit.

Apparatus described herein is particularly suited to the conversion of linear pulse code modulated telephone speech signals into analogue telephone speech signals, but the method and apparatus may provide intelligible signals when used with other digital signals.

The apparatus may be combined with a conventional PCM signal expander which is arranged to expand compressed PCM signals into linear PCM signals for application to the apparatus and in order to provide a digital-to-analogue converter having optimum performance in decoding compressed PCM. It has been found in practice that the use of an offset signal equivalent to V/16 in converting telephone speech signals from linear PCM into analogue form gives the best results when the clocking speed is 2.048 MHz. The optimum offset level may vary with the clocking speed.

I claim:

1. Apparatus for converting PCM information into a pulse density code, the PCM information consisting of parallel words of m bits expressed in two's complement form, the apparatus comprising:
   (a) an offset signal generator providing input ports to the said apparatus and arranged to add an offset signal to an input signal,
   (b) an accumulator having at least m+1 stages,
   (c) means responsive to the digit stores in the m+1th stage of the accumulator after the immediately preceding accumulation operation, to produce a two-state signal,
   (d) connection means arranged to apply output words from the offset signal generator to the m accumulator stages of lower significance, and arranged to apply, simultaneously, a signal dependent on the two-state signal to at least the m+1th accumulator stage, and
   (e) means responsive to the two-state signal to produce a pulse density code output corresponding to the PCM information word applied to the apparatus.

2. Apparatus for converting PCM information into a pulse density code as claimed in claim 1, wherein the accumulator comprises a plurality of logical adders coupled to corresponding register elements and arranged to provide the necessary system capacity.

3. Apparatus for converting PCM information into a pulse density code as claimed in claim 1, wherein the connection means includes an inverter for inverting the m digit of the output word before application to the accumulator and an inverter for inverting the two-state signal derived from the m+1th stage of the accumulator.

4. Apparatus for converting PCM information into a pulse density code as claimed in claim 2, wherein the connection means includes an inverter for inverting the m th digit of the output word before application to the accmulator and an inverter for inverting the two-state signal derived from the m+1th stage of the accumulator.

5. A digital-to-analogue converter for converting PCM information consisting of parallel words of m bits expressed in two's complement form, including:
   (a) an offset signal generator providing input ports to the said converter and arranged to add an offset signal to an input signal,
   (b) an accumulator having at least m+1 stages,
   (c) means responsive to the digit stores in the m+1th stage of the accumulator after the immediately preceding accumulation operation, to produce a two-state signal,
   (d) connection means arranged to apply output words from the offset signal generator to the m accumulator stages of lower significance, and arranged to apply, simultaneously, a signal dependent on the two-state signal to at least the m+1th accumulator stage,
   (e) means responsive to the two-state signal to produce a pulse density code output corresponding to the PCM information word, and
   (f) a low-pass filter arranged to provide an analogue output signal from the pulse density code output.

* * * * *